(12) United States Patent
Nowak

(10) Patent No.: US 11,276,817 B2
(45) Date of Patent: Mar. 15, 2022

(54) MAGNETIC TUNNEL JUNCTION HAVING TAPERED ALL-AROUND STRUCTURE

(71) Applicant: International Business Machines Corporation, Armonk, NY (US)

(72) Inventor: Janusz Jozef Nowak, Highland Mills, NY (US)

(73) Assignee: International Business Machines Corporation, Armonk, NY (US)

( * ) Notice: Subject to any disclaimer, the term of this patent is extended or adjusted under 35 U.S.C. 154(b) by 243 days.

(21) Appl. No.: 16/818,042

(22) Filed: Mar. 13, 2020

(65) Prior Publication Data

US 2021/0288247 A1    Sep. 16, 2021

(51) Int. Cl.
*H01L 43/12* (2006.01)
*H01L 27/22* (2006.01)
*H01L 43/10* (2006.01)
*H01L 43/08* (2006.01)

(52) U.S. Cl.
CPC ............ *H01L 43/12* (2013.01); *H01L 27/222* (2013.01); *H01L 43/08* (2013.01); *H01L 43/10* (2013.01)

(58) Field of Classification Search
CPC ....... H01L 43/12; H01L 27/222; H01L 43/08; H01L 43/10
USPC .......................................................... 257/421
See application file for complete search history.

(56) References Cited

U.S. PATENT DOCUMENTS

| | | | |
|---|---|---|---|
| 9,837,602 B2 | 12/2017 | Braganca | |
| 9,953,692 B1 | 4/2018 | Mihajlovic et al. | |
| 10,326,073 B1* | 6/2019 | Tzoufras | H01L 43/06 |
| 10,516,098 B2 | 12/2019 | Sayed et al. | |
| 2016/0118397 A1* | 4/2016 | Koka | H01L 27/11524 257/325 |
| 2019/0206931 A1* | 7/2019 | Gajek | H01L 27/228 |
| 2019/0207094 A1* | 7/2019 | Gajek | H01L 43/04 |
| 2019/0207102 A1* | 7/2019 | Gajek | H01L 43/12 |
| 2019/0295618 A1* | 9/2019 | Araki | G11C 11/1657 |
| 2019/0296224 A1* | 9/2019 | Araki | G11C 11/1659 |
| 2019/0296225 A1* | 9/2019 | Araki | G11C 11/14 |
| 2019/0296228 A1* | 9/2019 | Araki | G11C 11/161 |
| 2019/0296230 A1* | 9/2019 | Araki | H01F 10/3259 |
| 2020/0006637 A1 | 1/2020 | Gosavi et al. | |
| 2020/0013444 A1 | 1/2020 | Min et al. | |

FOREIGN PATENT DOCUMENTS

EP    3319134 A1    5/2018

OTHER PUBLICATIONS

Sato et al., "Physical Characterization of Two-Terminal SOT-MRAM Cell", Research Gate 2018, Jun. 2018, 20 pages. https://www.researchgate.net/publication/326007887_Physical_Characterization_of_Two-Terminal_SOT-MRAM_Cell.

Zhang et al., "Scaling Analysis and Application: Phase Diagram of Magnetic Nanorings and Elliptical Nanoparticles", arXiv:0709.4061v2 [cond-mat.str-el] Aug. 30, 2008, 8 pages.

(Continued)

*Primary Examiner* — Jami Valentine Miller

(74) *Attorney, Agent, or Firm* — Jeffrey M. Ingalls

(57) ABSTRACT

A method of manufacturing a magnetic tunnel junction device is provided. The method includes forming a conical insulator core, forming a conductor layer on the insulator core, forming a magnetic free layer on the conductor layer, forming a barrier layer on the magnetic free layer, and forming a magnetic fixed layer on the barrier layer.

20 Claims, 15 Drawing Sheets

(56) References Cited

OTHER PUBLICATIONS

Honjo et al., "First demonstration of field-free SOT-MRAM with 0.35 ns write speed and 70 thermal stability under 400° C. thermal tolerance by canted SOT structure and its advanced patterning/SOT channel technology", 2019 IEEE International Electron Devices Meeting (IEDM), 2019, 4 pages.
Garello et al., "SOT-MRAM 300mm integration for low power and ultrafast embedded memories", 2018 IEEE Symposium on VLSI Circuits, Submitted on Oct. 22, 2018, 2 pages. http://arxiv.org/ftp/arxiv/papers/1810/1810.10356.pdf.
Prenat et al., "Ultra-Fast and High-Reliability SOT-MRAM: From Cache Replacement to Normally-Off Computing", IEEE Transactions on Multi-Scale Computing Systems, vol. 2, No. 1, Jan.-Mar. 2016, 12 pages.
Liu et al., "Spin-Torque Switching with the Giant Spin Hall Effect of Tantalum", Research Article, Science, vol. 336, May 4, 2012, 5 pages.
Ikeda et al., "Tunnel magnetoresistance of 604% at by suppression of Ta diffusion in CoFeB/MgO/CoFeB pseudospin-valves annealed at high temperature", Appl. Phys. Lett. 93, Aug. 25, 2008 (2008); https://doi.org/10.1063/1.2976435, 4 pages.
Khang et al., "A conductive topological insulator with large spin Hall effect for ultralow power spin-orbit torque switching", Nature Materials, vol. 17, Sep. 2018, 7 pages. www.nature.com/naturematerials.

\* cited by examiner

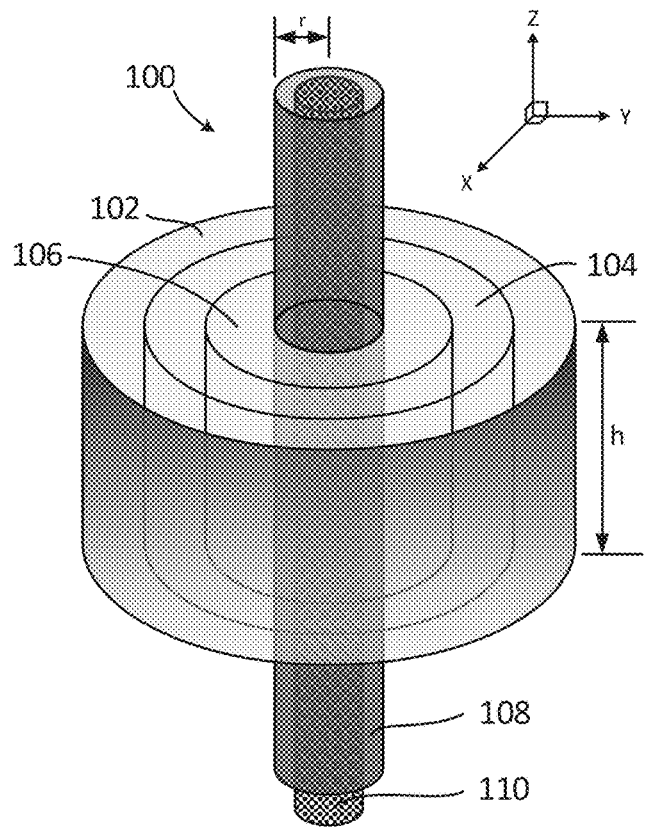
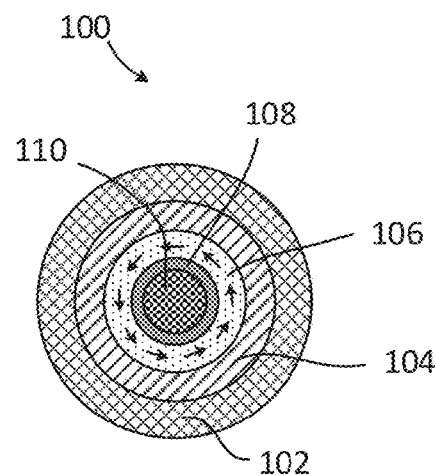
FIG. 1A
FIG. 1B
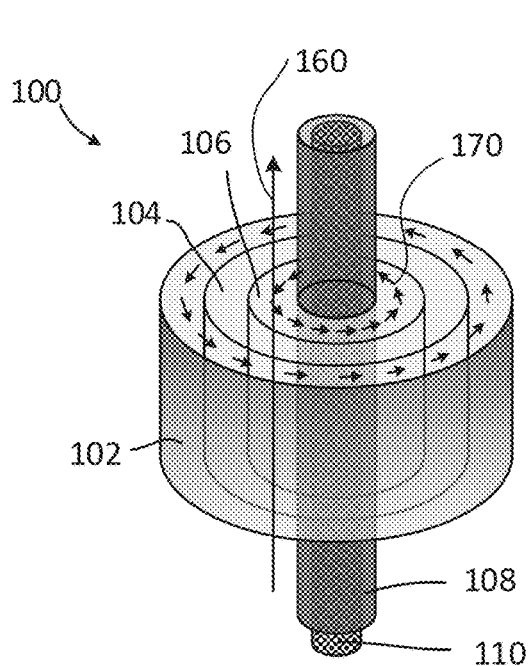
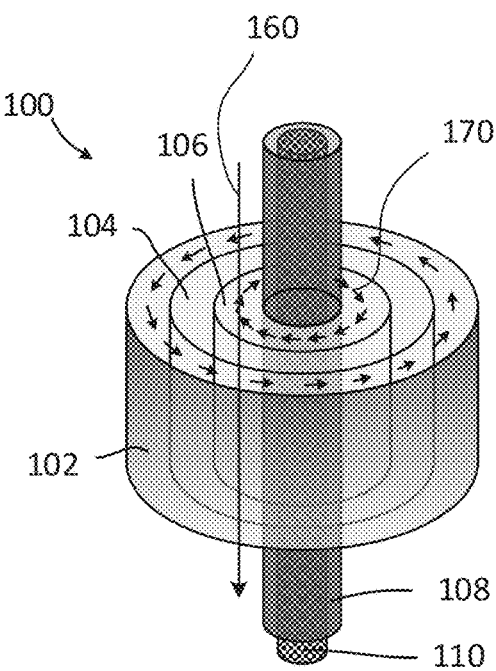
FIG. 1C
FIG. 1D

US 11,276,817 B2

MAGNETIC TUNNEL JUNCTION HAVING TAPERED ALL-AROUND STRUCTURE

BACKGROUND

The present disclosure relates to the electrical, electronic and computer fields. In particular, the present disclosure relates to magnetoresistive random-access memory ("MRAM") device cells including magnetic tunnel junction ("MTJ") stacks and methods of manufacturing MRAM devices. Certain MTJ devices have a pillared structure (i.e., a stack of materials) having a cylindrical shape, where current flows from a top layer to a bottom layer, or vice versa, in order to switch the magnetization of a ferromagnetic layer. These types of MTJ devices are generally referred to as spin transfer torque (STT) MTJ devices. Other types of MTJ devices are referred to as spin orbit torque (SOT) devices. However, with certain SOT MTJ designs, a very large amount of SOT torque is not utilized at parts of the SOT layer which are not in contact with free layer. As a result, SOT torque switching efficiency is low and high current densities are needed to switch free layer.

SUMMARY

Embodiments of the present disclosure relate to a method of manufacturing a magnetic tunnel junction device. The method includes forming a conical insulator core, forming a conductor layer on the insulator core, forming a magnetic free layer on the conductor layer, forming a barrier layer on the magnetic free layer, and forming a magnetic fixed layer on the barrier layer.

Other embodiments relate to a magnetic tunnel junction. A magnetic tunnel junction device includes a conical insulator core, a conductor layer provided on the insulator core, a magnetic free layer provided on the insulator core, a barrier layer provided on the magnetic free layer, and a magnetic fixed layer provided on the barrier layer.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

FIG. 1A is a perspective view of at least a portion of a spin orbit torque (SOT) magnetic tunnel junction (MTJ) device having an all-around layered configuration, according to embodiments.

FIG. 1B is a top plan view of the MTJ device of FIG. 1A.

FIG. 1C is a perspective view of at least a portion of the MTJ device of FIG. 1A, illustrating current flowing in a first direction.

FIG. 1D is a perspective view of at least a portion of the MTJ device of FIG. 1A, illustrating current flowing in a second direction opposite to the direction shown in FIG. 1C.

Figure 2:
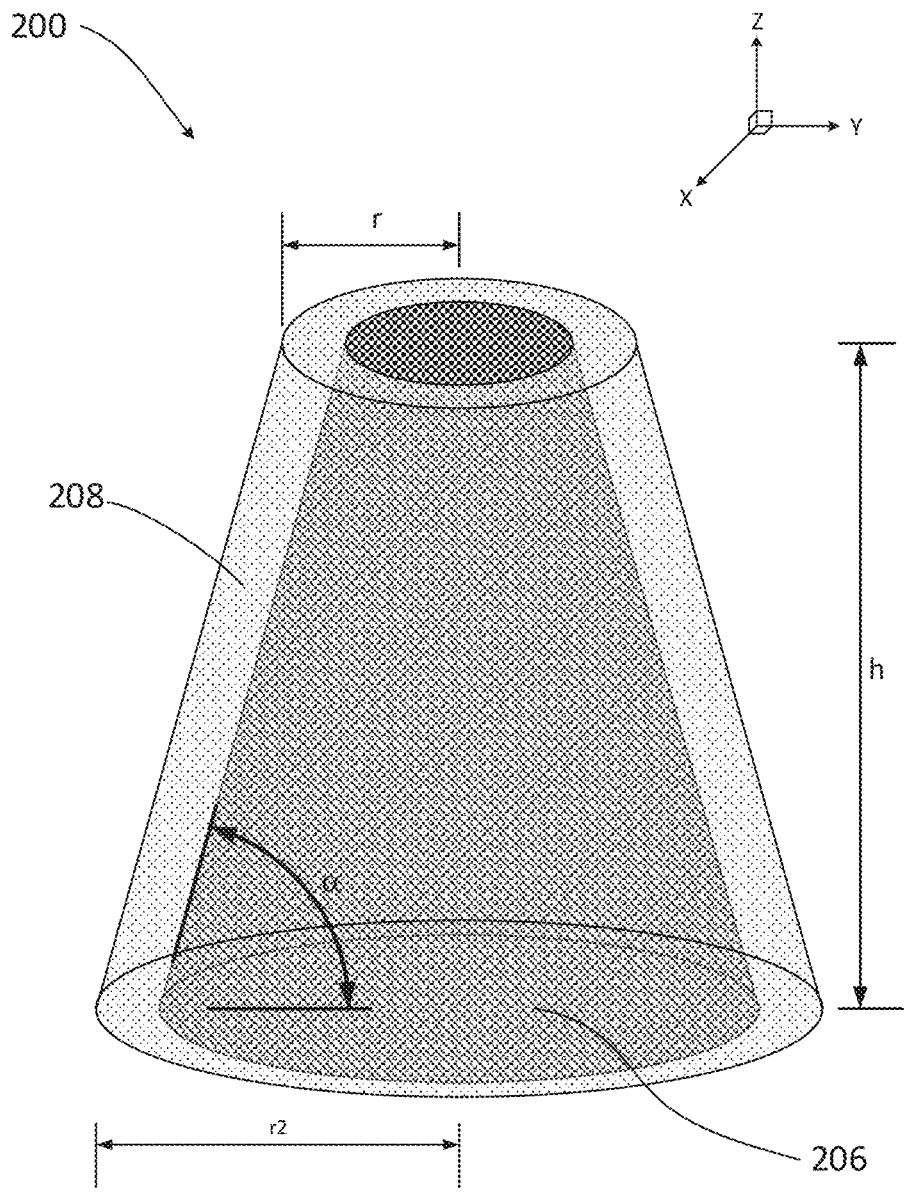
FIG. 2 is a perspective view of a portion of an MTJ device depicting the concentric funnel shape of certain of the device layers, according to embodiments.

It should be appreciated that elements in the figures are illustrated for simplicity and clarity. Well-understood elements that may be useful or necessary in a commercially feasible embodiment may not be shown for the sake of simplicity and to aid in the understanding of the illustrated embodiments.

DETAILED DESCRIPTION

The present disclosure describes MRAM devices including magnetic tunnel junction ("MTJ") stacks and methods of manufacturing MRAM devices. In particular, the present disclosure describes MTJ devices where the layers of the MTJ (e.g., the magnetic free layer, the tunnel barrier layer, and the magnetic fixed layer) are formed in concentric funnel-shaped layers about a central insulating core having a truncated conical (or funnel) shape.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, embedded DRAM (eDRAM) is a dynamic random-access memory (DRAM) integrated on the same die or multi-chip module (MCM) of an application-specific integrated circuit (ASIC) or microprocessor. eDRAM has been implemented in silicon-on-insulator (SOI) technology, which refers to the use of a layered silicon-insulator-silicon substrate in place of conventional silicon substrates in semiconductor manufacturing. eDRAM technology has met with varying degrees of success, and demand for SOI technology as a server memory option has decreased in recent years. Magnetoresistive random-access memory (MRAM) devices using magnetic tunnel junctions (MTJ) are one option to replace existing eDRAM technologies. MRAM is a non-volatile memory, which is a type of computer memory that can retrieve stored information even after power has been cycled. This benefit of being able to store information even when power is cycled is a driving factor that is accelerating the development of this memory technology.

A magnetic tunnel junction (MTJ) device, which is a primary storage element in a magnetic random access memory (MRAM), is a magnetic storage and switching device in which two ferromagnetic layers are separated by a thin insulating barrier (e.g., aluminum oxide) to form a stacked structure. One of the ferromagnetic layers has a magnetization that is fixed, and it is therefore referred to as a fixed layer or pinned layer or reference layer. However, the other ferromagnetic layer has a magnetization that can change, and it is therefore referred to as a free layer. When a bias is applied to the MTJ device, electrons that are spin polarized by the ferromagnetic layers traverse the insulating barrier through a process known as quantum tunneling to generate an electric current whose magnitude depends on an orientation of magnetization of the ferromagnetic layers. The MTJ device will exhibit a low resistance when a magnetic moment of the free layer is parallel to the fixed layer magnetic moment, and it will exhibit a high resistance when the magnetic moment of the free layer is oriented anti-parallel to the fixed layer magnetic moment.

The materials and geometries used to build the stack of different layers forming the MTJ device are factors that affect the characteristics of the device in terms of speed (i.e., switching time) and power consumption (e.g., voltage and/or current required to switch the device from one state to another). As discussed briefly above, certain MTJ devices have a pillared structure (i.e., a stack of materials) having a cylindrical shape, where current flows from a top layer to a bottom layer, or vice versa, in order to switch the magnetization of one ferromagnetic layer. These types of MTJ devices are generally referred to as spin transfer torque (STT) MTJ devices. Certain STT MRAM devices may have limited switching speed and endurance in comparison to static random access memory (SRAM) devices (i.e., random access memory that retains data bits in its memory as long as power is being supplied). Other types of MTJ devices are referred to as spin orbit torque (SOT) devices. In the SOT type of device, the stacked pillar structure is still cylindrically shaped, but the stack is deposited on top of a heavy metal conductor. In the SOT type of MTJ device, current flows horizontally in this conductor and switches the magnetization of the ferromagnetic layer at the interface.

In both the STT and the SOT MTJ devices, which have cylindrically shaped stacks, the surface area of the interface with the free layer is equal to the area of a circle ($A=\pi r^2$, where A is the area of the interface and r is the radius of the cylinder stack). The energy (power×time) that is required to switch the state of the MTJ device is still relatively high, which is undesirable. Moreover, with certain of these stacked SOT MTJ designs, a very large amount of SOT torque is not utilized at parts of SOT layer which are not in contact with free layer. As a result, SOT torque switching efficiency is low and high current densities are needed to switch free layer. In addition, the manufacturing of these types of MTJ devices can be complicated.

Referring now to the drawings in which like numerals represent the same or similar elements and initially to FIGS. 1A-1D, an all-around structure of an SOT MTJ device to which the present embodiments may be applied is shown. It should be appreciated that although the devices shown in FIGS. 1A-1D have a generally cylindrically layered configuration (i.e., for the sake of simplicity and ease of understanding with regard to the basic components and operation of the device), the embodiments described hereinbelow have a tapered shape (or funnel shape, or truncated conical shape).

FIG. 1A is a perspective view depicting at least a portion of an exemplary MTJ device 100 having an all-around structure. The MTJ device 100 uses an SOT-based switching mechanism. While embodiments of the present disclosure are not limited to any specific number of material layers, the basic MTJ structure shown in FIGS. 1A-1D includes five principal layers for clarity of description. An insulator core 110 is a central structure oriented along a major axis that is substantially vertical (i.e., the Z-axis). Although the insulator core 110 in FIGS. 1A-1D is shown as a generally cylindrical shape for ease of illustration and understanding with regard to the basic functioning of an SOT type MTJ device, the embodiments described herein (see e.g., FIG. 2) have a tapered or pillar shape as discussed in detail below. A spin orbit torque (SOT) conductor 108 surrounds the insulator core 110. As also shown in FIGS. 1A-1D, other layers of the MTJ device 100 include: a reference ferromagnetic layer (i.e., reference layer 102 or fixed layer or pinned layer) with unchanged magnetization (spins up or down); a free ferromagnetic layer (i.e., free layer 106) with reconfigurable magnetization (e.g., the spin can be changed using an applied bias current and/or voltage); and a barrier layer 104 (i.e., tunnel barrier layer) disposed between the fixed layer 102 and the free layer 106. The free layer 106 surrounds the SOT conductor 108. As shown in FIGS. 1A-1D, each of the fixed layer 102, the barrier layer 104 and the free layer 106 surround the SOT conductor 108 in a generally concentric manner.

The free layer 106 is the layer directly contacting and thus forming an interface with the SOT conductor 108. By passing a current 160 through the SOT conductor 108 in one direction (see, FIG. 1C) or another (see, FIG. 1D), a physical phenomenon will occur at the interface with the free layer 106 which may switch an orientation (i.e., direction) of magnetization 170 of the free layer depending on the direction of the current 160. This change in magnetization of the free layer 106 will cause the overall MTJ device 100 to exhibit a change in resistance, which may be read out to be in either a "0" state or a "1" state.

Referring now to FIG. 2, a perspective view of certain layers of an MTJ device 200 depicting the concentric funnel shaped design is shown. In particular, an insulator core 206 is formed in a funnel or truncated conical shape at an angle α relative to a horizontal surface (i.e., the X-Y plane), as will be described in further detail below. Similar to the configuration discussed above with respect to FIGS. 1A-1D, an SOT conductor 208 is formed to surround the central insulator core 206. Although not shown in FIG. 2 for the sake of simplicity and ease of illustration, it should be understood that analogous layers (i.e., a free layer, a fixed layer and a barrier layer) are concentrically formed around the central insulator core 206 and SOT conductor 208 layers. By forming the MTJ device where the various layers of the MTJ device are arranged concentrically around the central insulator core 206 in an all-around configuration, the surface areas of the interfaces between adjacent layers (e.g., between the SOT conductor 208 and the free layer 702 (see, FIG. 7)) will be substantially increased compared to the circular area of a conventional MTJ stack. More particularly, with reference to FIGS. 2 and 7, the interface between the free layer 702 and the SOT conductor 208 is generally the outer surface of the SOT conductor layer 208 (not including the upper and lower surfaces thereof). In certain embodiments, where the SOT conductor 208 is substantially a truncated conical shape, the area of this interface will be approximately:

$$SA=\pi(r+r2)\sqrt{(h^2+(r^2-r)^2}$$

where SA is the total interface surface area, r is the upper radius of the SOT conductor 208, r2 is the lower radius of the SOT conductor 208, and h is the height of the SOT conductor 208 in the Z-axis direction. Thus, the surface area of the interface between the free layer 702 (see, FIG. 7) and the SOT conductor 208, and hence a switching efficiency of the MTJ device 200, can be controlled as a function of the height as well as the upper and lower radii of the SOT conductor 208. This represents a maximal interface area utilization relative to a standard SOT MTJ stack in which only a small part of the SOT layer is in contact with free layer. In addition to providing a substantial increase in the interface area between the free layer 702 and the SOT conductor 208, the circumferential magnetization of the free layer in the all-around structure of the MTJ device 200 achieves enhanced stability.

Figure 3:
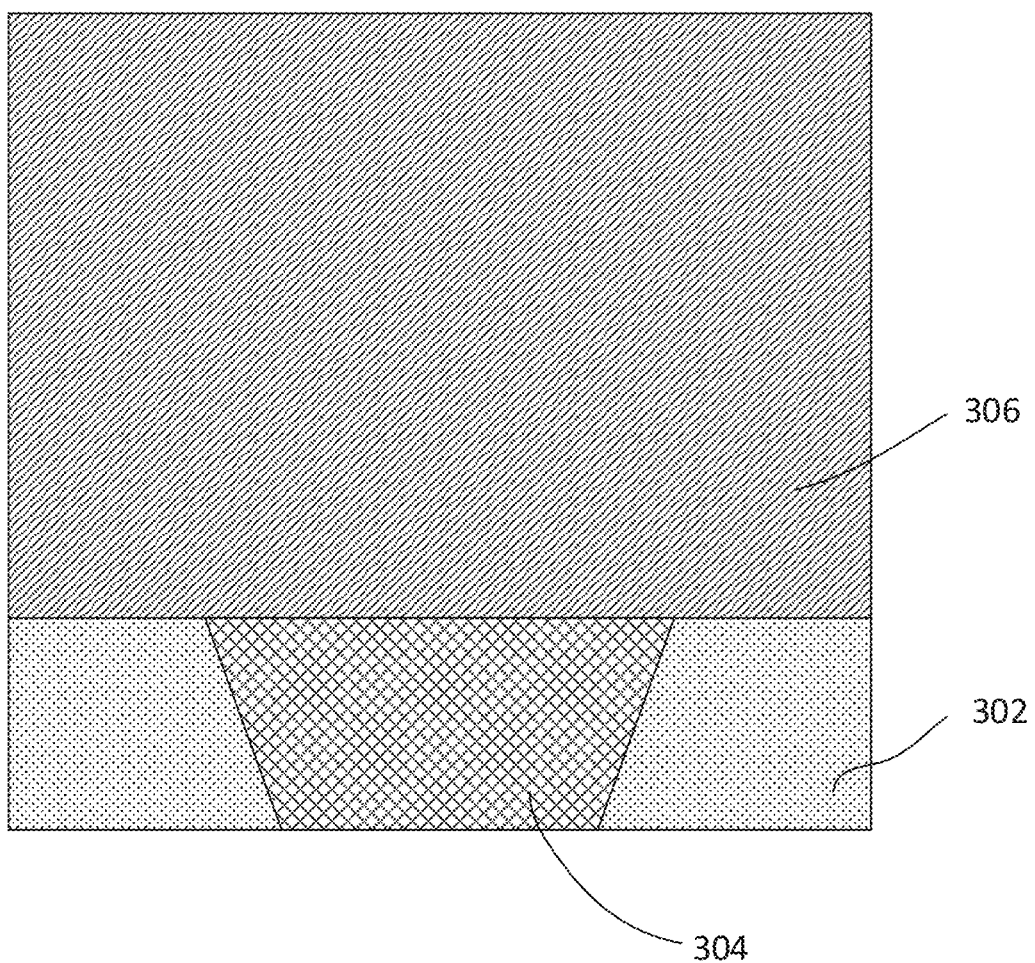
FIG. 3 is a cross-sectional view depicting an MTJ device at an intermediate stage of the manufacturing process, according to embodiments.

Referring now to FIG. 3, front end of line (FEOL) layers are formed. In general, the FEOL is the portion of IC fabrication where the individual devices (transistors, capacitors, resistors, etc.) are interconnected with wiring on the wafer. As shown in FIG. 3, a via dielectric layer 302 is formed. Initially, the via dielectric layer 302 may be formed by patterning via lithography. Then, a via is formed in the via dielectric layer 302 by, for example, RIE to remove a space for subsequent filling with the via fill layer 304. In certain embodiments, the via fill layer 304 may include a material such as W, Cu, TaN, Ta, Ti, TiN, TiOCN, TaOCN, or a combination of these materials. The via fill layer 304 can be formed by CVD, PVD, ALD or a combination thereof. In FIG. 3, the via fill layer 304 is shown to be formed with a slant angle, where a width of this layer become wider nearer the upper portion thereof. However, it should be appreciated that the via fill layer can be formed to have vertical or nearly vertical sidewalls, or any other suitable sidewall profile. After the via fill layer 304 is formed, the structure is subjected to, for example, CMP to planarize the surface for further processing. The structure including the FEOL layers shown in FIG. 3 is a starting structure upon which the MTJ device layers are to be formed.

Figure 4:
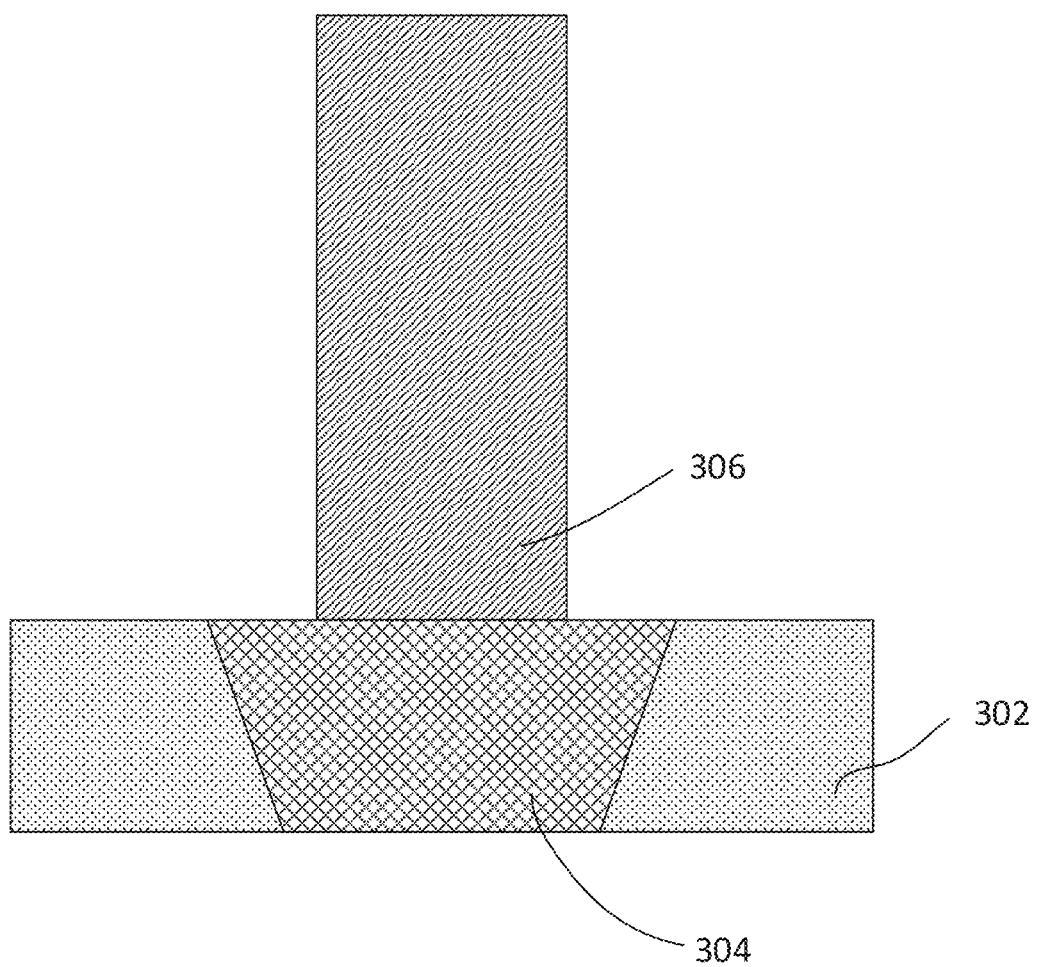
FIG. 4 is a cross-sectional view of the MTJ device of FIG. 3 after additional fabrication operations, according to embodiments.
Figure 5:
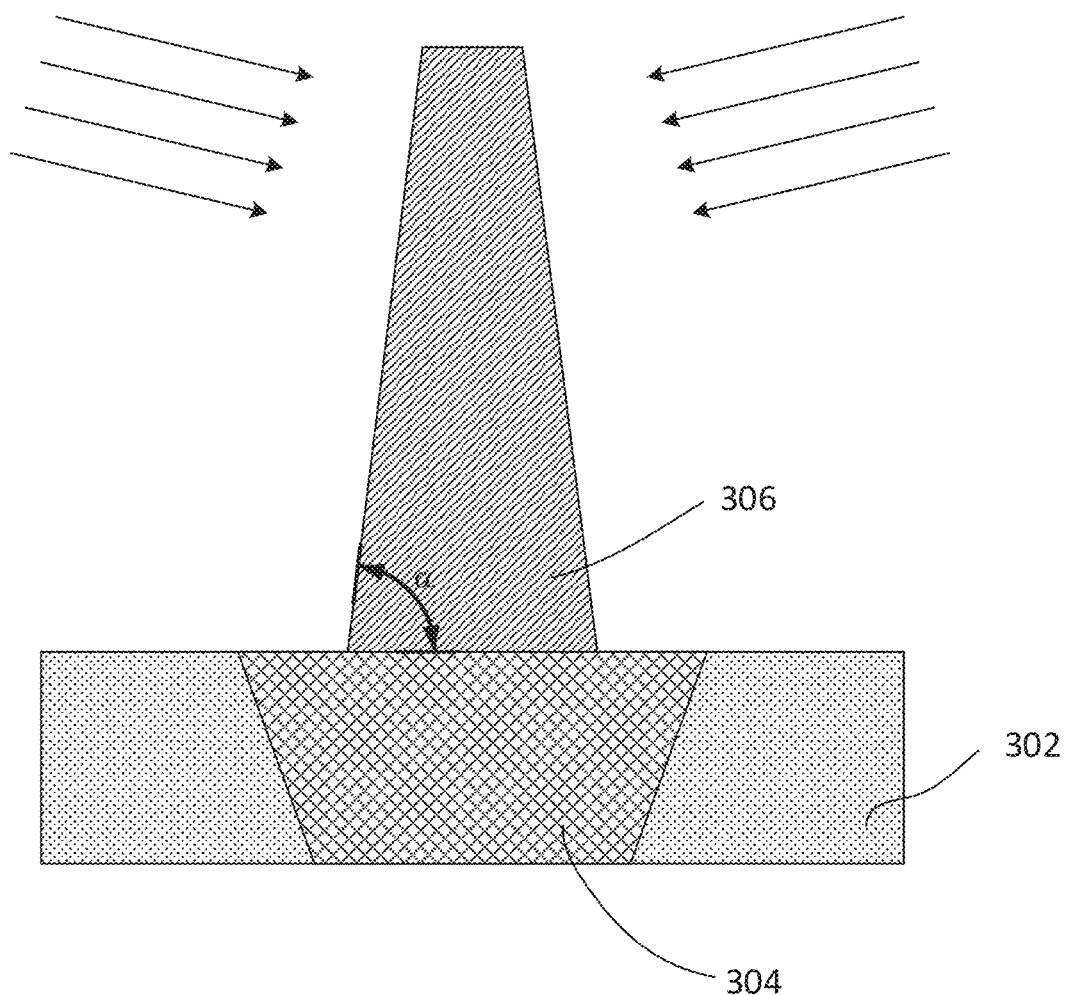
FIG. 5 is a cross-sectional view of the MTJ device of FIG. 4 after additional fabrication operations, according to embodiments.

As shown in FIGS. 4-5, the central insulator core 306 is formed. Initially, as shown in FIG. 3, the central insulator core 306 layer is formed as a relatively thick layer over the entirety of the via dielectric layer 302 and the via fill layer 304. Next, in certain embodiments, as shown in FIG. 4, the central insulator core 306 layer is subjected to lithography processing to form pillars out of the central insulator core 306. At this stage of the manufacturing process, the central insulator core 306 layer has a generally cylindrical shape with at least substantially vertical sidewalls, as shown in FIG. 4. Then, as shown in FIG. 5, the central insulator core 306 layer is subjected to high angle ion beam etching (IBE) to form a truncated conical shape having an angle α with respect to the X-Y horizontal plane of the via dielectric layer. In certain embodiments, the angle α may be in the range of about 45 degrees to less than 90 degrees. In other embodiments, α may be in the range about 70 degrees to less than 90 degrees. In certain embodiments, the central insulator core 306 comprises a suitable dielectric material (e.g., silicon dioxide, silicon nitride (SiN), silicon oxynitrate (SiOxNy), etc.) and may range from about 5-100 nm in diameter and about 50-200 nm in height, where the diameter gradually decreases from a lower surface to an upper surface thereof. It should be appreciated that the insulator core 306 is not limited to any specific materials or dimensions. However, as shown in FIG. 5, the width of the lower surface of the insulator core 306 (i.e., the surface proximate to the upper surface of the via fill layer 304) is less than the width of the upper surface of the insulator core 306 (i.e., due to the tapered conical shape). The smaller width of the insulator core 306 relative to the width of the via fill layer 304 will allow for subsequent formation of portions of the SOT conductor 602 (see, FIG. 6) and portions of the free layer 702 (see, FIG. 7) to be formed directly above the portions of the via fill layer 304 that are not covered by the insulator core 306.

Referring generally now to FIGS. 6-9, several layers (i.e., the SOT conductor 602, the free layer 702, the barrier layer 802, and the fixed layer 902) are deposited around the central insulator core 306 at different deposition angles relative to a horizontal surface of the wafer. Varying the angle of material deposition allows control of the relative widths and heights of different portions of these layers. In particular, at a very steep deposition angle θ (e.g., 10-15 degrees offset from a vertical direction) a majority of the material will deposit on horizontal surfaces of the underlying layer with smaller amounts being deposited on the vertical surfaces (or the slanted nearly vertical surfaces) thereof. In contrast, at a very shallow deposition angle θ (e.g., 75-80 degrees offset from the vertical direction) a majority of the material will deposit on the vertical surfaces (or the slanted nearly vertical surfaces) of the underlying layer with smaller amounts being deposited on the horizontal surfaces thereof. Thus, varying the deposition angle allows for layer by layer control of the relative thicknesses of the horizontal and vertical portions of the particular layer.

Figure 6:
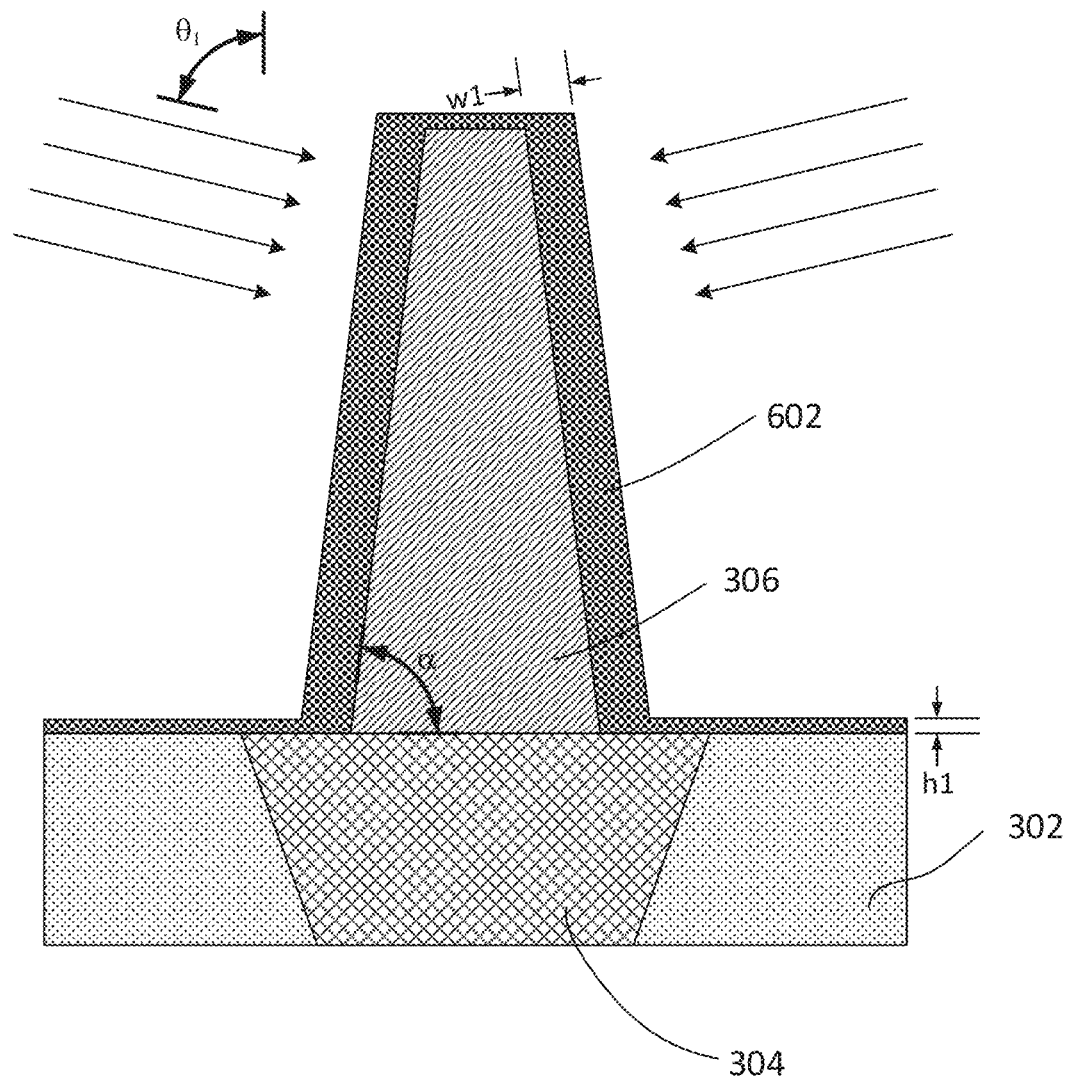
FIG. 6 is a cross-sectional view of the MTJ device of FIG. 5 after additional fabrication operations, according to embodiments.

Referring now specifically to FIG. 6, an SOT conductor 602 layer is deposited around the insulator core 306. This SOT conductor 602 is deposited at a very shallow deposition angle $\theta_1$ (e.g., 80 degrees offset from the vertical direction). In other words, the material deposition is closer to the horizontal direction than it is to the vertical direction. This enables formation of the SOT conductor 602 having a height h1 (or thickness) on the horizontal surfaces of the underlying via dielectric layer 302 and via fill layer 304 that is relatively less than a width w1 (or thickness) of the layer on the tapered sidewall surfaces of the insulator core 306. In certain embodiments, the thicknesses of the layers deposited on the wafer plane and on the walls of the cone depend on the deposition angle θ and the cone angle α, where ideally parallel deposition beams are described by the following formula: $t_{pillar}/t_{plane} = \cos(\alpha-\theta)/\cos(\theta)$. In the spaces between adjacent MTJ devices 100 (i.e., away from the conical funnel structure), the height h1 of the SOT conductor 602 is very thin (e.g., <1 nm). Such an extremely thin layer of SOT conductor material will be almost completely nonconductive (or completely nonconductive) when it is in contact with a properly formed via dielectric layer 302, which should have an excess of oxygen (e.g., when using tetraethyl orthosilicate (TEOS) in production of the via dielectric layer 302). However, the sidewall portions of the SOT conductor 602 having the relatively greater width w1 (or thickness) are conductive. In one example, when the SOT conductor 602 is deposited at an angle of approximately 80 degrees, the thickness of the layers on the cone walls is about 20 Å thick, whereas the thickness on the wafer plane and other horizontal surface are about 3.5 Å thick. Thus, in this example, the w1 is about six times greater than h1.

In one or more embodiments, the SOT conductor 602 comprises at least one SOT metal, which is preferably a heavy metal such as, for example, tungsten (W), platinum (Pt), tantalum (Ta), iridium (Ir), Hafnium (Hf), osmium (Os), bismuth (Bi), lead (Pb), etc., and their specific crystallographic phases. Other materials of the SOT conductor 602 may include IrMn, PtMn, Heusler alloys, or combinations thereof. Further materials of the SOT conductor 602 may include room temperature topological insulators such as $Bi_xSe_{1-x}$, $Bi_xSb_{1-x}$ and $Bi_xSb_yTe_z$. The SOT conductor 602 may be formed as a thin shell of SOT metal (e.g., about 2-20 nanometers (nm) thick) disposed on the sidewalls and top surface of the insulator core 306.

Figure 7:
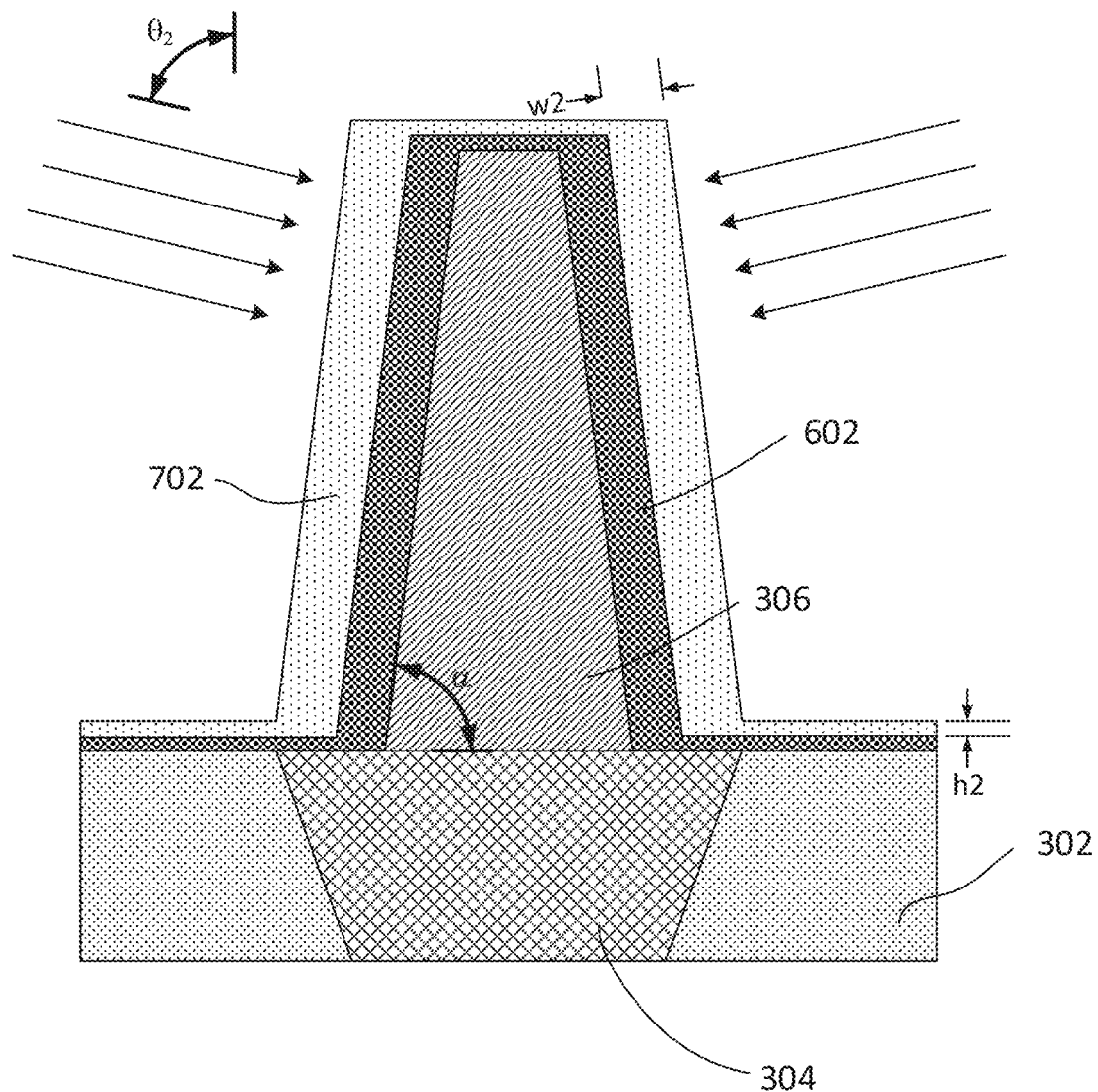
FIG. 7 is a cross-sectional view of the MTJ device of FIG. 6 after additional fabrication operations, according to embodiments.

Referring now specifically to FIG. 7, a free layer 702 (i.e., magnetic free layer) is deposited around the SOT conductor 602. This free layer 702 is also deposited at a very shallow deposition angle $\theta_2$ (e.g., 80 degrees offset from the vertical direction). In other words, similar to the previous formation of the underlying SOT conductor 602, the material deposition is closer to the horizontal direction than it is to the vertical direction. It should be appreciated that the deposition angle may be varied, and the deposition angle $\theta_2$ of the free layer 702 may be somewhat different than the deposition angle $\theta_1$ used in the formation of the SOT conductor 602 layer. The shallow deposition angle $\theta_2$ enables formation of the free layer 702 with a height h2 (or thickness) on the horizontal surfaces of the underlying SOT conductor 602 that is relatively less than a width w2 (or thickness) on the tapered sidewall surfaces of the SOT conductor 602. Similar to the SOT conductor 602, in the spaces between adjacent MTJ devices 100 (i.e., away from the conical funnel structure), the height h2 of the free layer 702 is very thin (e.g., <1 nm). Such an extremely thin layer of magnetic free layer material will also be nonconductive in these areas. However, the sidewall portions of the free layer 702 having the relatively greater width w2 (or thickness) are conductive. In one example, when the free layer 702 is deposited at an angle of approximately 80 degrees, the thickness of both layers on the cone walls is about 40 Å thick, whereas the thickness on the wafer plane and other horizontal surface are about 3.5 Å thick. Thus, in this example, a combined thickness of the horizontal portions of the free layer 702 and the horizontal portions of in the wafer plane is about 7 Å thick, which should still be essentially nonconductive, because both surfaces of this bilayer are contacting insulating layers. It should be appreciated that somewhat thinner layers could be formed to ensure that these combined layers are nonconductive in the wafer plane. In particular after free layer is deposited additional oxidation/implantation steps can be done to minimize conduction of the free layer 702 in wafer plane.

In certain embodiments, the sidewall portions of the free layer 702 and the SOT conductor 602 (the vertical portions contributing to the concentric funnel-shaped structure) are formed above the via fill layer 304 in the Z-axis direction (i.e., and not above the via dielectric layer 302). In other words, the via fill layer 304 is formed to be wide enough to accommodate the layered conical sidewall structure of the central insulator core 306, the SOT conductor 602 and the free layer 702.

In one or more embodiments, the free layer 702 may comprise a suitable magnetic material such as, for example, cobalt, iron, boron, or a combination thereof. In certain embodiments, the free layer 702 is comprised of CoFeB having a thickness w2 in the range of 10 Å-50 Å. In certain embodiments, the free layer 702 may comprise bilayers of CoFeB for high magnetoresistance (MR), one or more layers of body centered cubic (BCC) $Co_{25}Fe_{75}$, and/or other low damping compositions for fast switchability. In certain embodiments, the free layer 702 may comprise CoX, FeX, or alloys thereof, where X is a light metal. In certain embodiments, the free layer 702 may comprise bilayers of ultrathin CoFeB for high magnetoresistance (MR), one or more layers comprising Huesler alloys (e.g., $Co_2FeAl$ or NiMnSb), and/or other low damping material compositions for fast switchability. In certain embodiments, the free layer 702 may comprise bilayers of CoFeB and soft materials (e.g., Py) to avoid domain wall formation.

Figure 8:
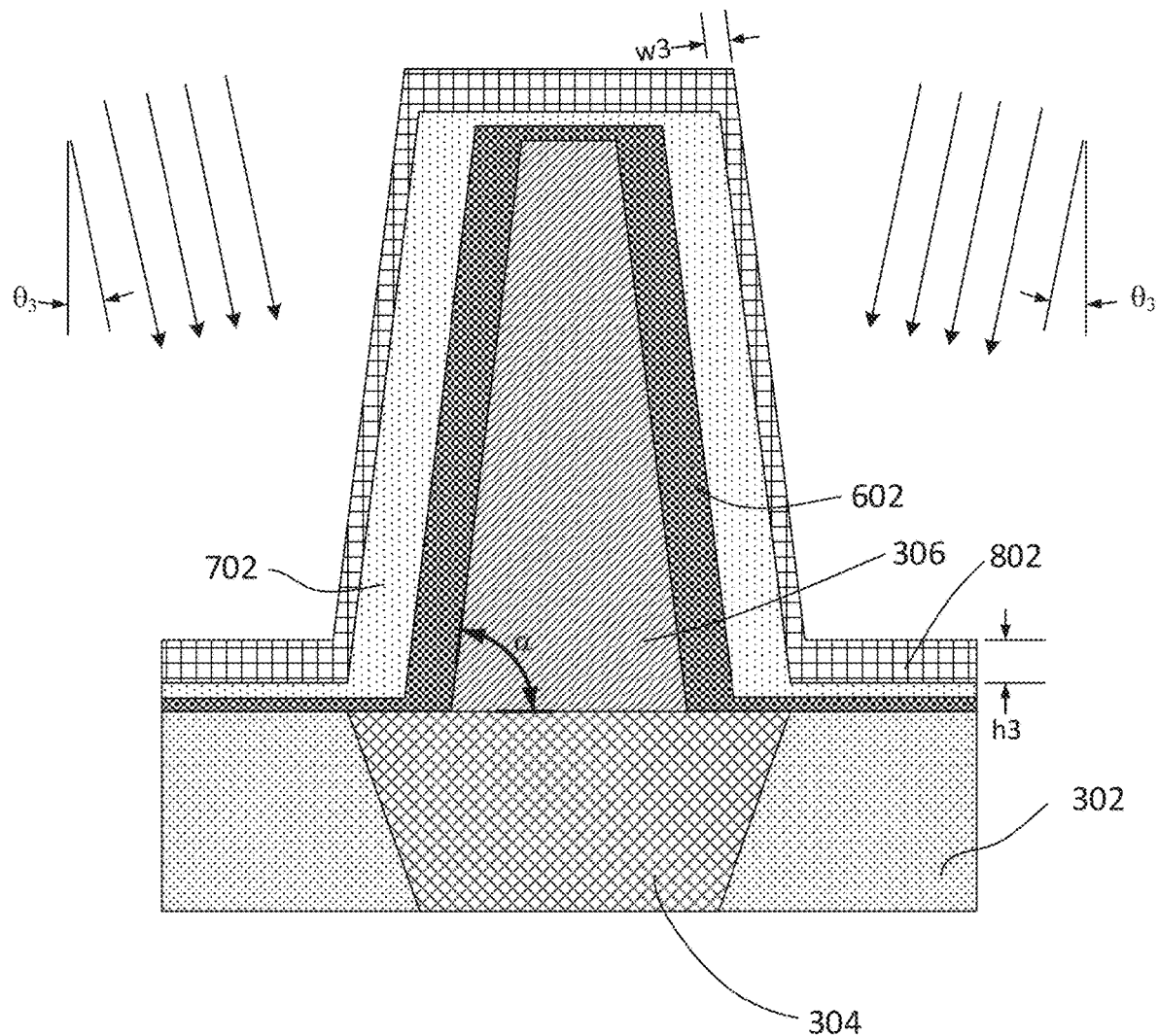
FIG. 8 is a cross-sectional view of the MTJ device of FIG. 7 after additional fabrication operations, according to embodiments.

Referring specifically now to FIG. 8, a barrier layer 802 is formed on the underlying free layer 702. The barrier layer 802 may comprise an insulating material that is disposed on all surfaces of the underlying free layer 702. In certain embodiments, the barrier layer 802 is a tunnel barrier, such as a thin insulating layer, between two electrically conducting materials. Electrons pass through the tunnel barrier by the process of quantum tunneling. In contrast to the formation of the underlying SOT conductor 602 and the free layer 702, the formation of the barrier layer 802 is deposited at a very steep deposition angle $\theta_3$ (e.g., 15 degrees offset from the vertical direction). In other words, the material deposition is closer to the vertical direction than it is to the horizontal direction. It should be appreciated that the deposition angle may be varied somewhat. The steep deposition angle $\theta_3$ enables formation of the barrier layer 802 with a height h3 (or thickness) on the horizontal surfaces of the underlying free layer 702 that is relatively greater than a width w3 (or thickness) on the tapered sidewall surfaces of the barrier layer 802. Although the barrier layer 802 is generally composed of an insulating material, electrons are able to pass through the layer according to the quantum mechanical phenomenon of quantum tunneling up to a certain thickness of the layer. The relatively narrow width w3 (or thickness) of the sidewall portions of the barrier layer 802 are thin enough to allow for the quantum tunneling. However, the horizontal portions of the barrier layer 802 (e.g., the portions above the via dielectric layer) having the relatively greater height h3 (or thickness) are too thick to allow for (i.e., they preclude) quantum tunneling. In one example, when the barrier layer 802 is deposited at an angle of approximately 15 degrees, the thickness of the layer on the cone walls w3 is about <10 Å thick, whereas the thickness h3 on the wafer plane and other horizontal surfaces is about 23 Å thick (thus, this portion of the tunnel barrier will be about 1,000-10,000 times more resistive). Accordingly, due to the particular deposition angle during formation of this layer, a single barrier layer 802 is formed that has different thicknesses in different locations, and thus different physical properties in different locations.

In certain embodiments, the barrier layer 802 comprises at least one of magnesium oxide (MgO), $TiO_2$, $CsO_x$, $BaO_x$, $SrO_x$, $ZrO_2$, $HfO_2$ and $Al_2O_3$, or any suitable combination thereof. In certain embodiments, the barrier layer 802 may comprise one or more complex oxide materials such as MgAlO. It should be appreciated that other suitable materials may be used for the barrier layer 802 which provide good tunnel barrier properties.

Figure 9:
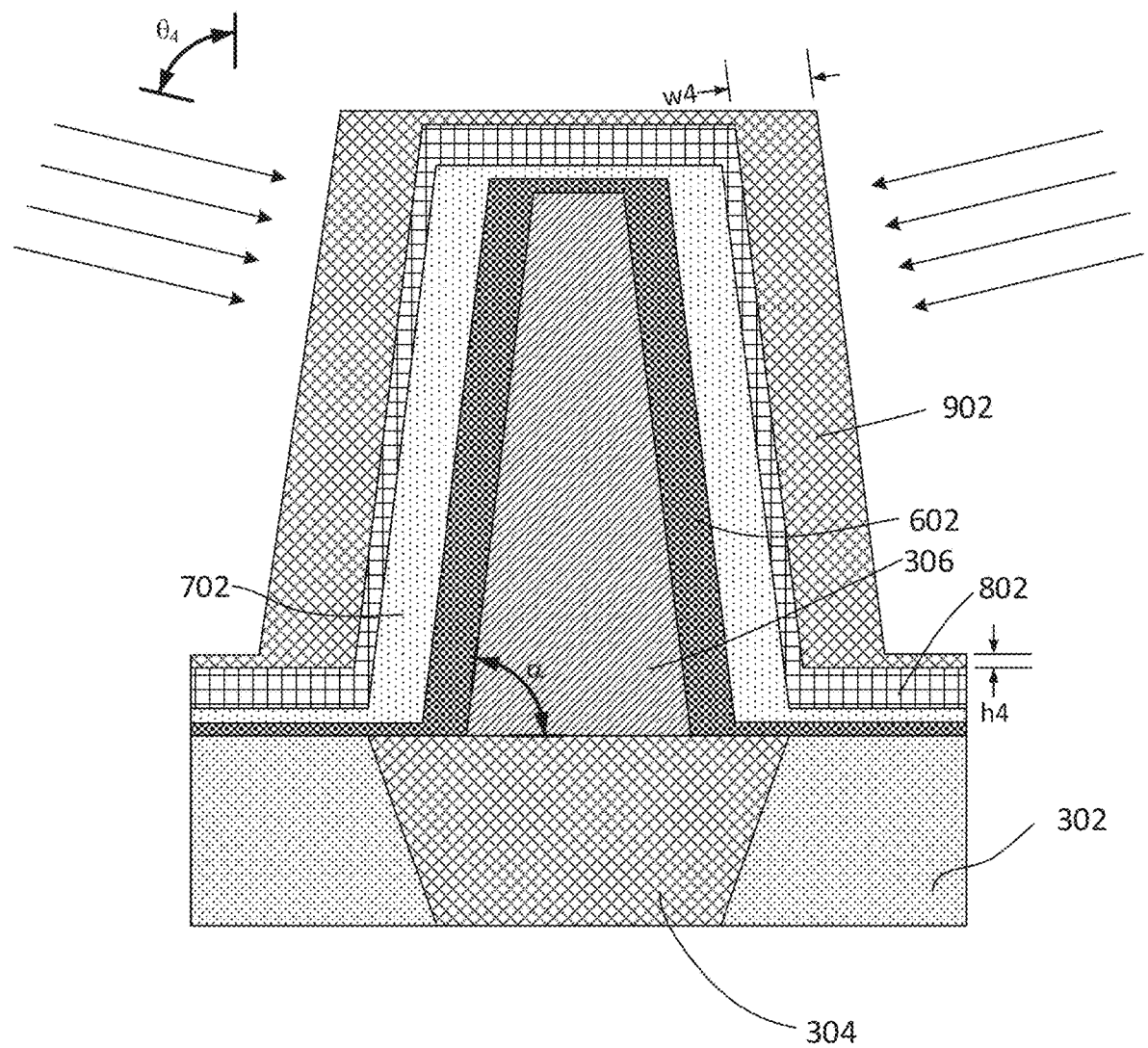
FIG. 9 is a cross-sectional view of the DMTJ device of FIG. 8 after additional fabrication operations, according to embodiments.

Referring specifically now to FIG. 9, a fixed layer 902 (i.e., magnetic fixed layer or reference layer) is deposited around the barrier layer 802. This fixed layer 902 is also deposited at a very shallow deposition angle $\theta_4$ (e.g., 80 degrees offset from the vertical direction). In other words, similar to the previous formation of the underlying SOT conductor 602 and the free layer 702, the material deposition is closer to the horizontal direction than it is to the vertical direction. It should be appreciated that the deposition angle may be varied, and the deposition angle $\theta_4$ of the fixed layer 902 may be someone different than the deposition angles $\theta_1$ and $\theta_2$ used in the formation of the SOT conductor 602 layer and the free layer 702, respectively. The shallow deposition angle $\theta_4$ enables formation of the fixed layer 902 with a height h4 (or thickness) on the horizontal surfaces of the underlying barrier layer 802 that is relatively less than a width w4 (or thickness) on the tapered sidewall surfaces of the barrier layer 802. Similar to the SOT conductor 602, in the spaces between adjacent MTJ devices 100 (i.e., away from the conical funnel structure), the height h4 of the fixed layer 902 is very thin (e.g., <1 nm). Such an extremely thin layer of magnetic fixed layer material will also be nonconductive in these areas. However, the sidewall portions of the fixed layer 902 having the relatively greater thickness (or width) of w4 and form a strong stable ferromagnet. In one example, when the fixed layer 902 is deposited at an angle of approximately 80 degrees, the width w4 (or thickness) of the layers on the cone walls is about 30 Å thick, whereas the height h4 (or thickness) on the wafer plane and other horizontal surfaces is about 5 Å thick. It should be appreciated that a somewhat thinner reference layer is present in the wafer plane to ensure very low conductance in the wafer plane. In particular, after the fixed layer 902 is deposited, additional oxidation/implantation steps may be performed to minimize conduction of the portions of the fixed layer 902 located in wafer plane.

In certain embodiments, the fixed layer 902 comprises a suitable magnetic material such as, for example, cobalt, iron, boron, platinum, nickel, tungsten, iridium, or a combination thereof. In certain embodiments, the fixed layer 902 is comprised of CoFeB having a thickness in the range of 20 Å-100 Å. In certain embodiments, the fixed layer 902 may comprise bilayers of CoFeB and high damping materials (e.g., heavy metals) to improve reference layer resilience to STT current. In certain embodiments, the fixed layer 902 may comprise bilayers of CoFeB and antiferromagnetic material layers to pin the CoFeB. In certain embodiments, the fixed layer 902 may comprise bilayers of CoFeB and synthetic antiferromagnetic (SAF) layers to minimize a dynamical stray field acting on the free layer 702 during switching operations.

Figure 10:
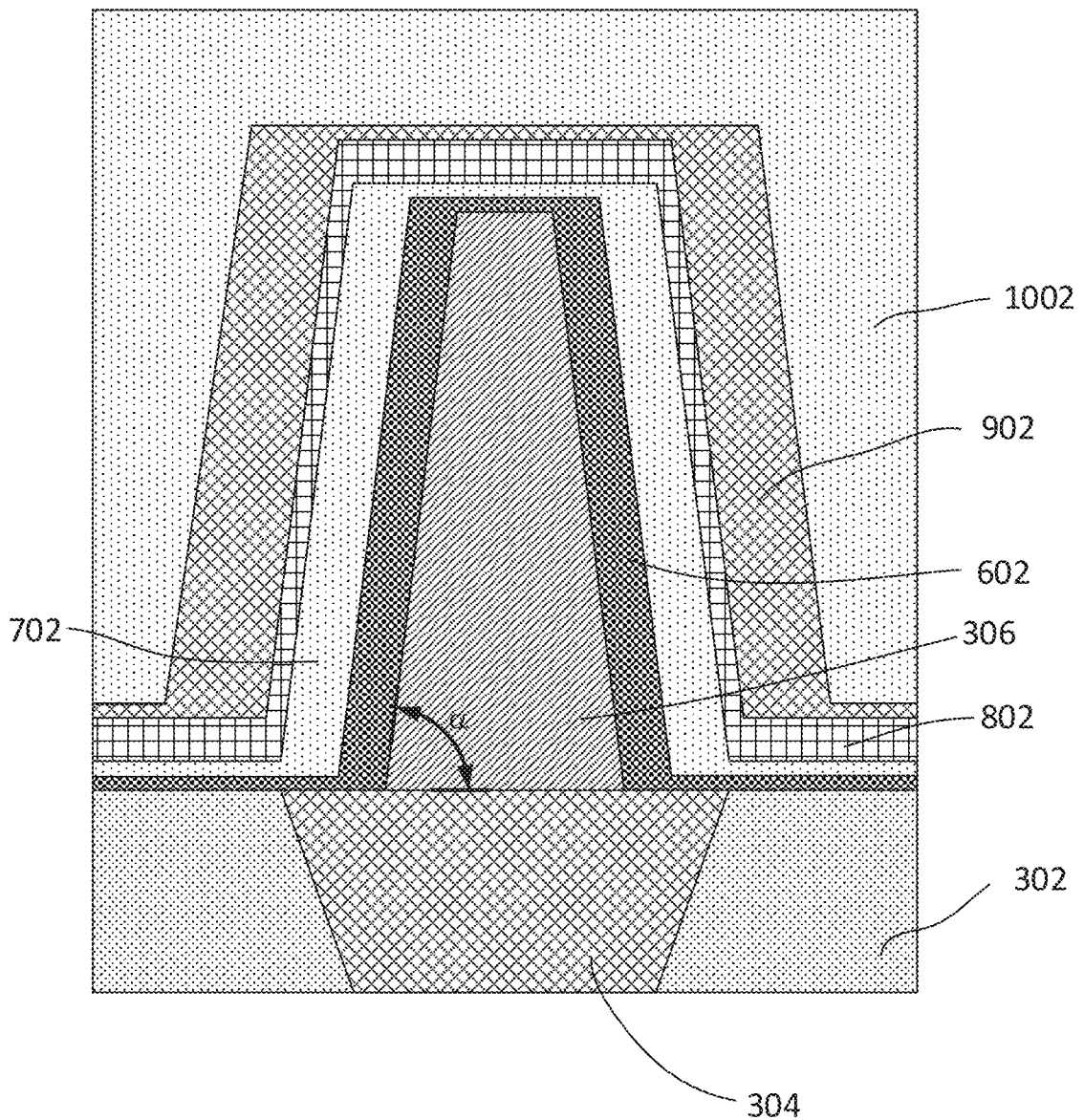
FIG. 10 is a cross-sectional view of the DMTJ device of FIG. 9 after additional fabrication operations, according to embodiments.

Referring now to FIG. 10, a read bit line 1002 is formed. Initially, a layer of metal is deposited over the entire wafer. Then, a lithography operation is performed to define the read bit line 1002. Then, the metal of the read bit line 1002 is etched down to the level of the via dielectric layer 302 between adjacent MTJ devices 100.

Figure 11A:
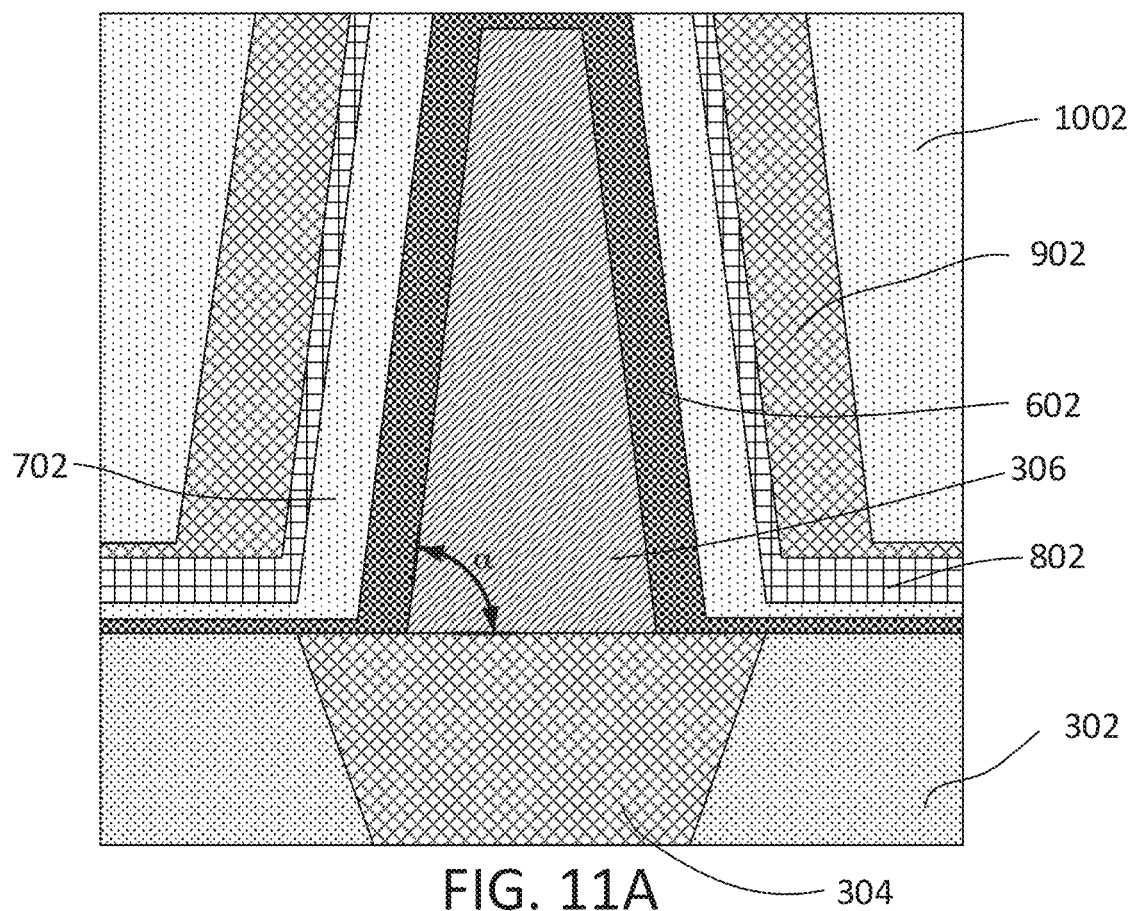
FIG. 11A is a cross-sectional view of the DMTJ device of FIG. 10 after additional fabrication operations, according to embodiments.
Figure 11B:
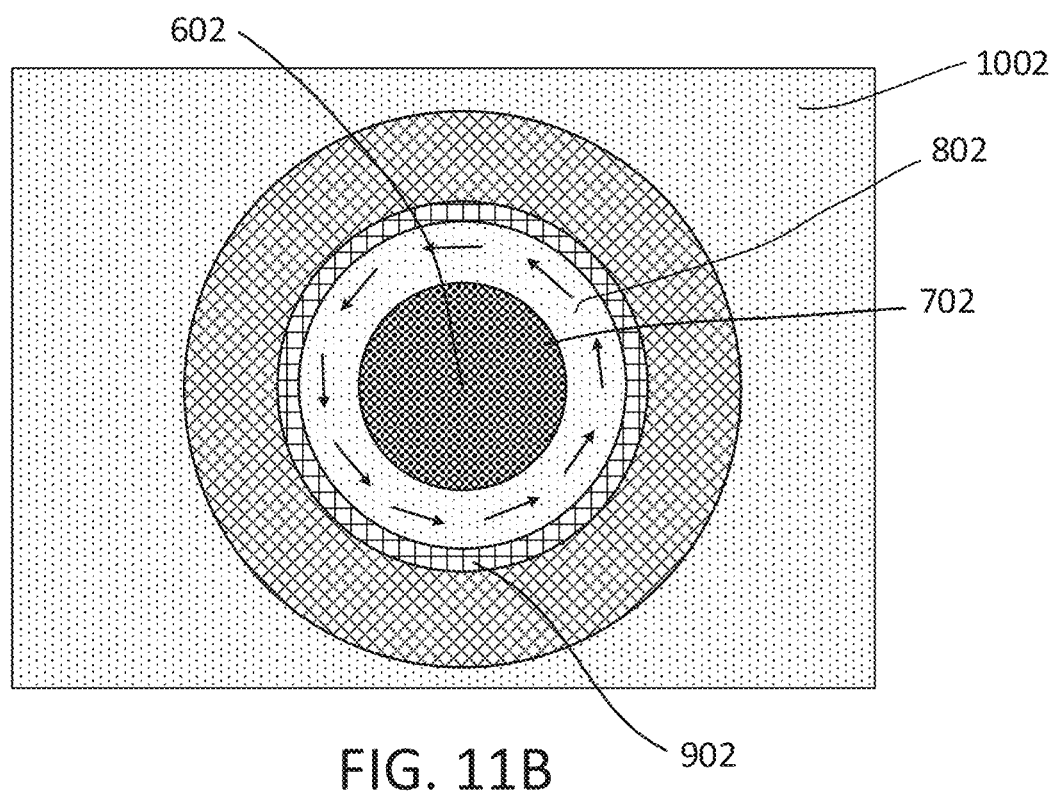
FIG. 11B is a top plan view of the MTJ device of FIG. 11A.

Referring now to FIGS. 11A and 11B, a removal process such as CMP is performed on the devices, and material is removed down to the level of the SOT conductor 602, as shown in FIG. 11A. As shown in the top-down view of FIG. 11B, the SOT conductor 602 (despite being a very thin layer at the top of the conical structure) remains after the CMP removal process. In other embodiments, the portion of the SOT conductor 602 at the top of the conical structure may be partially or completely removed.

Figure 12:
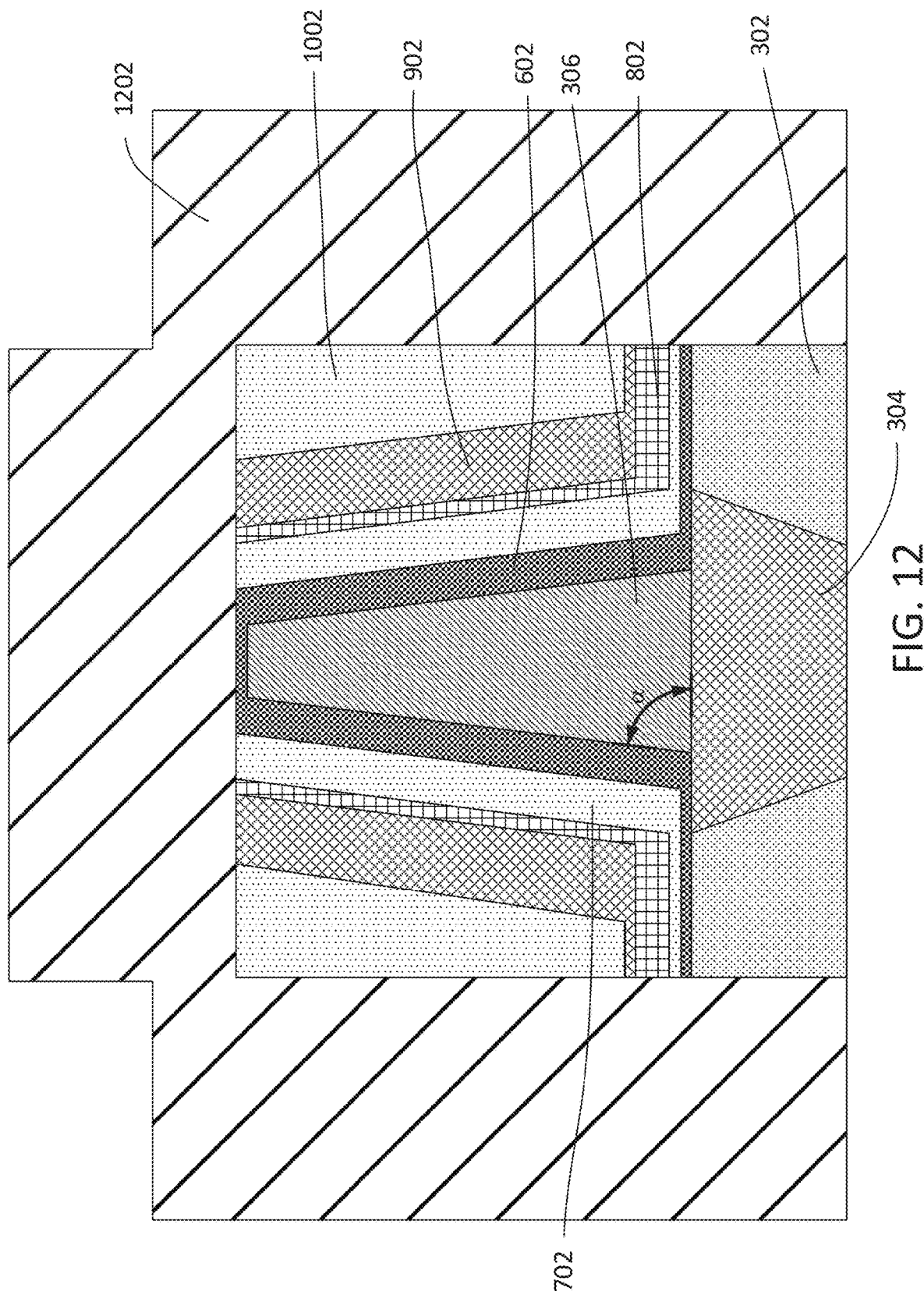
FIG. 12 is a cross-sectional view of the DMTJ device of FIG. 11 after additional fabrication operations, according to embodiments.

Referring now to FIG. 12, a first interlayer dielectric (ILD) layer 1202 is formed to conformally cover the exposed surfaces of the SOT conductor 602, the free layer 702, the barrier layer 802, the fixed layer 902, and the read bit lines 1002. For example, the first ILD layer 1202 may comprise at least one of PVD, ALD, PECVD, AlOx, $TiO_x$, BN, SiN and SiBCN. In certain embodiments, the deposition of the first ILD layer 1202 is a conformal cover, and in other embodiments the first ILD layer 1202 is deposited by an anisotropic directional deposition technique.

Figure 13:
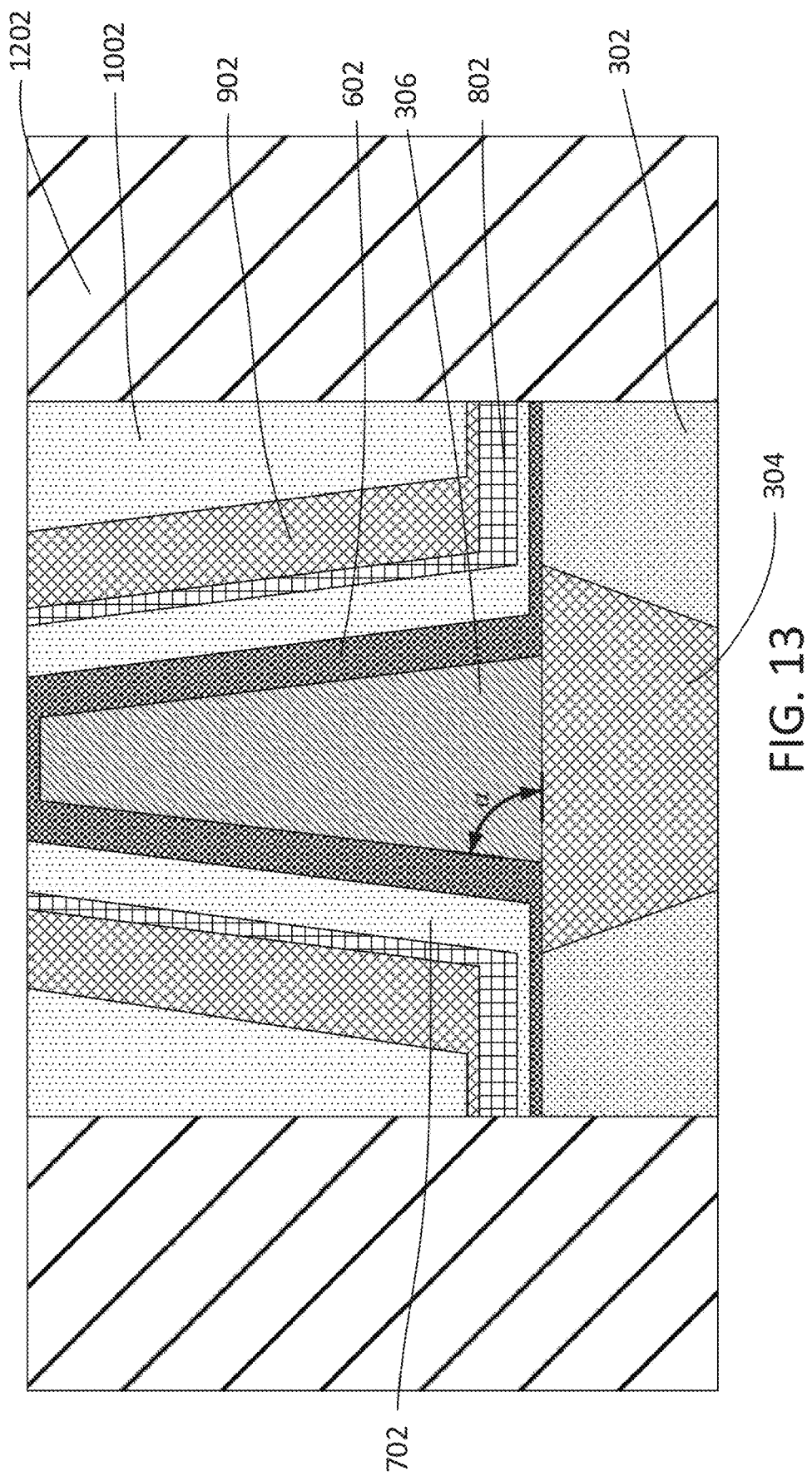
FIG. 13 is a cross-sectional view of the DMTJ device of FIG. 12 after additional fabrication operations, according to embodiments.
Figure 14:
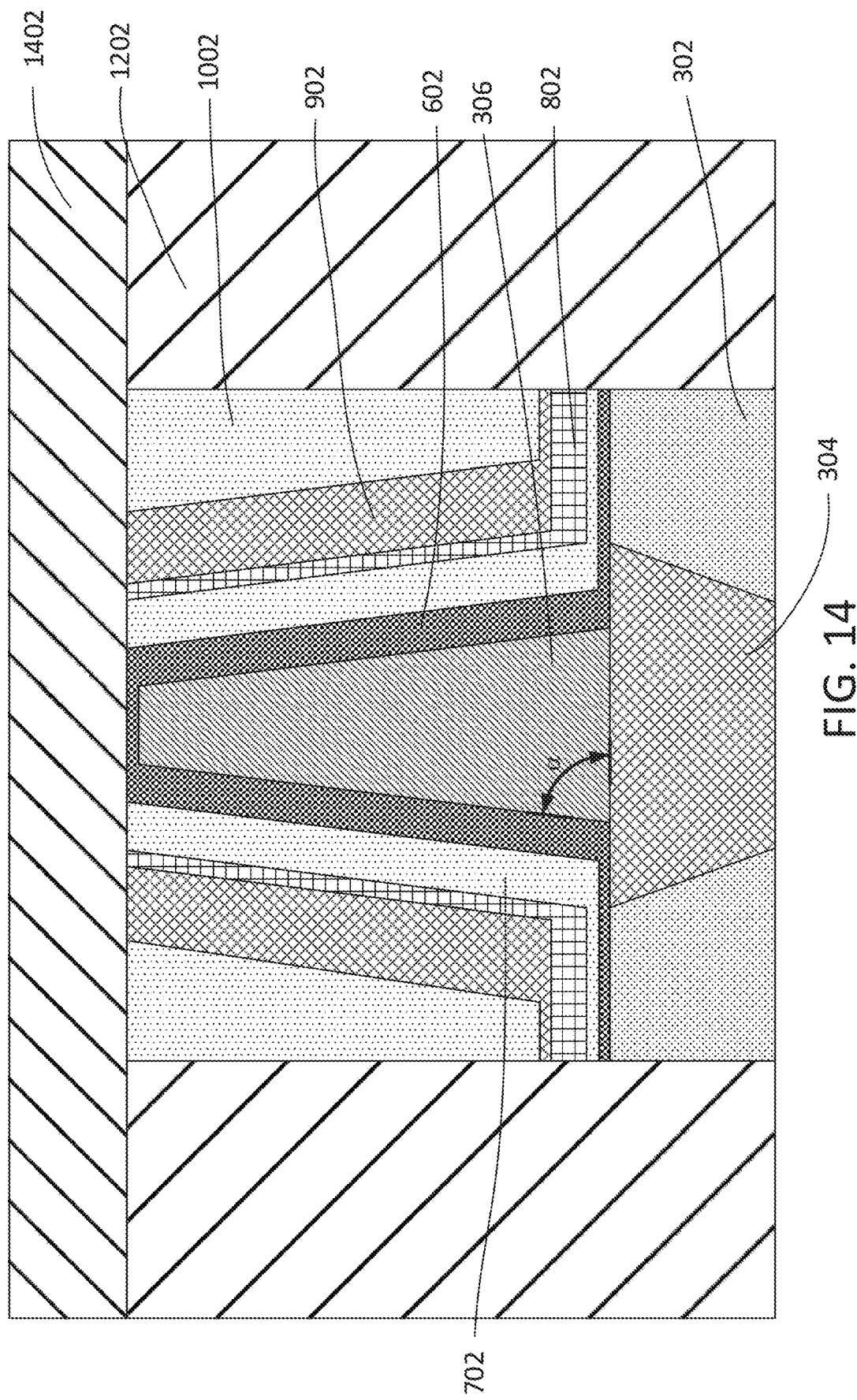
FIG. 14 is a cross-sectional view of the MTJ device of FIG. 13 after additional fabrication operations, according to embodiments.

Referring now to FIG. 13, in certain embodiments, a CMP planarization process is performed on the MTJ device 100 to expose upper surfaces of the SOT conductor 602, the free layer 702, the barrier layer 802, the fixed layer 902, and the read bit lines 1002. Referring now to FIG. 14, following the CMP planarization process, a second ILD layer 1402 is formed by a lithography process. In other embodiments, only a portion of the thickness of the first ILD layer 1202 is removed by the CMP process. In these embodiments, it is not necessary to form the second ILD layer 1402 where the remaining portions of the first ILD layer 1202 already cover the upper surface of the SOT conductor 602, the free layer 702, the barrier layer 802, the fixed layer 902, and the read bit lines 1002.

Figure 15:
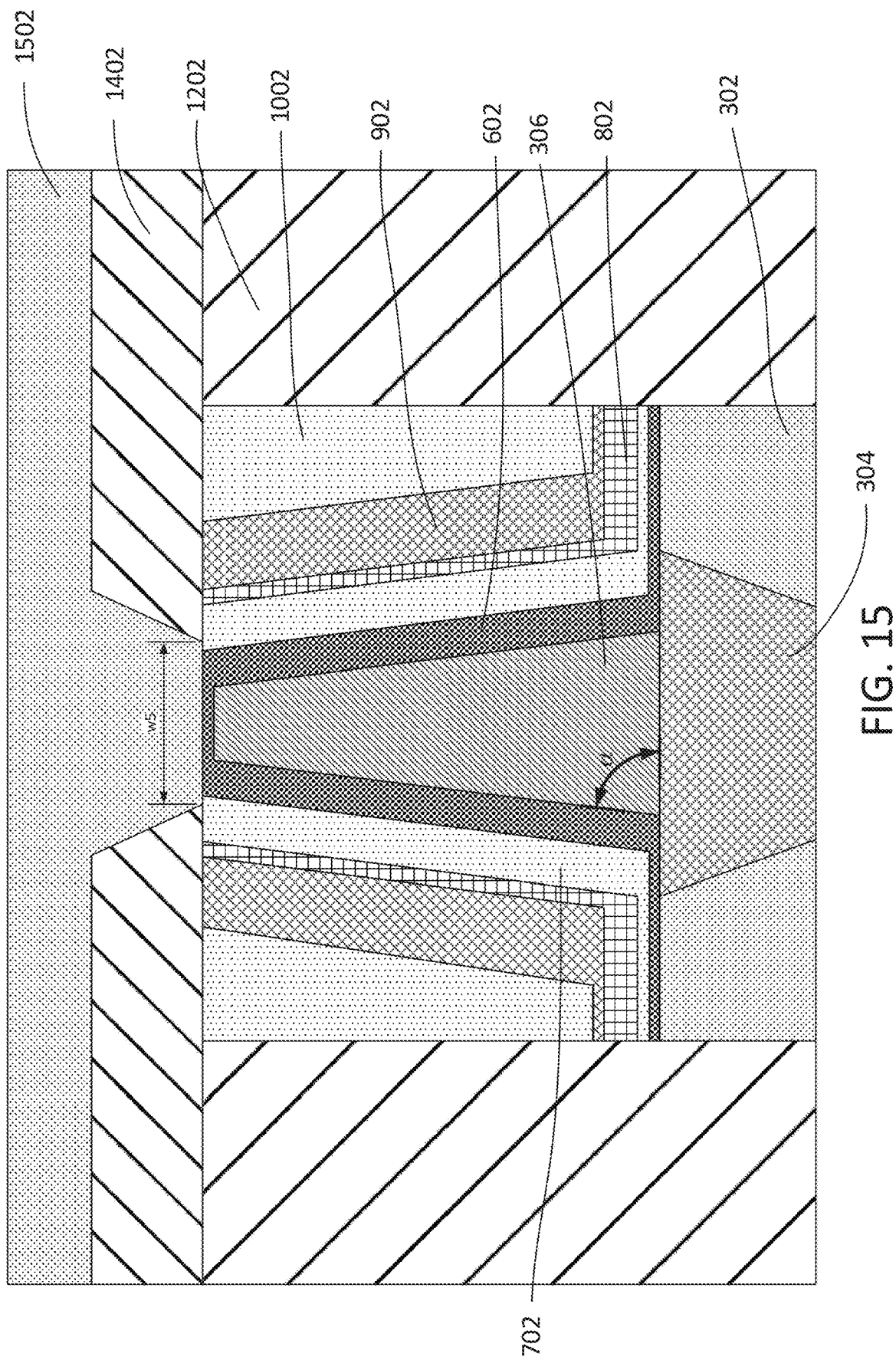
FIG. 15 is a cross-sectional view of the MTJ device of FIG. 14 after additional fabrication operations, according to embodiments.

Referring to FIG. 15, the second ILD layer 1402 is subjected to a removal process (e.g., RIE) to remove portions of the second ILD layer 1402 and once again expose the SOT conductor 602. Following the RIE process, a write bit line 1502 is formed. In certain embodiments, the write bit line 1502 is composed of Ta, TaN, Cu, or any suitable combination thereof. In certain embodiments, the width w5 of the opening formed in the second ILD layer 1402 is sufficient to expose the entire upper surface of the SOT conductor 602. In other embodiments, the width w5 may be sufficient to expose the entire upper surface of the SOT conductor 602 and portions of the upper surface of the free layer 702.

In certain of the embodiments described herein, the MTJ device 100 is a three terminal device, but it is oriented perpendicularly with respect to the wafer surface in order to achieve high bit density. To write "1" or "0" the current direction is changed like in conventional MRAM (see also, FIGS. 1C and 1D) using the write bit line 1502 and a complementary write bit line (not shown). Read out is done by sensing tunnel current flowing through the fixed layer 902, which is connected to a separate sensing read bit line 1002.

The embodiments described herein describe three-dimensional MTJ devices 100 with funnel like shapes, which enable high SOT switching efficiency by allowing unobstructed spin current flow around the whole free layer 702 and SOT conductor 602 layer interface. As a result, SOT torque can be transferred to the free layer 702 across whole interface between the SOT conductor 602 layer and the free layer 702. This design geometry allows for improved switching efficiency. This opens a way to use SOT MRAM as a universal memory, which can eliminate the need for both SRAM and Flash memory, and existing computer memory hierarchy can be greatly reduced or even eliminated.

To determine a proper ratio of funnel radius to funnel height, and proper thicknesses of the magnetic layers (e.g., the free layer 702 and the fixed layer 902), local magnetization vectors in both the free layer 702 and the fixed layer 902 will curl in the plane of the corresponding funnels, and the magnetization direction will be parallel to funnel edges forming a flux closed structure (i.e., a vortex state). This vortex state is energetically stable and ensures topologically the best possible retention in a broad range of temperatures in which the nano-magnetic funnel is ferromagnetic.

During an SOT write operation, electron current flows through the SOT conductor 602 layer while spin current flows for STO layer to free layer 702. This configuration allows for uniform delivery of spin orbit torque to the free layer 702. The flux closed structure of the free layer 702 magnetization configuration may allow for picosecond switching, which enables the MTJ devices 100 of the present embodiments to compete with SRAM in terms of speed.

In certain embodiments, the total resistance of the SOT layer and free layer conductor 602 can be adjusted to match select transistor currents and ensure high current densities by changing six different parameters: the SOT conductor 602 layer material, the SOT conductor 602 radius, the STO conductor 602 height, the SOT conductor 602 thickness, the free layer 702 thickness, and the free layer 702 material composition. These parameters allow for optimization of free layer 702 switching. In certain embodiments, the free layer 702 funnel is relatively short to ensure a flux closed vortex in both the free layer 702 and the fixed layer 902. Also, in certain embodiments, the exchange length for both free and reference layer materials is larger than the device dimensions to avoid the formation of domain walls inside the vortex structure.

In certain examples, if the aspect ratio (k=height/radius) of the overall nanofunnel structure is smaller than approximately 1.81, the nanofunnel will have a magnetization parallel to the funnel circumference, thus forming a stable vortex state. To ensure a proper uniform vortex state with magnetization in-plane of the funnel and parallel to funnel edges, the free layer 702 material may have a strong exchange, high MsT and low magneto-crystalline anisotropies to avoid any domain walls formed therein. For such free layer 702 materials, a proper uniform vortex state (i.e., without domain walls) will be formed spontaneously as the device patterning process is completed. In certain embodiments, a post-process anneal or short rapid thermal anneal may be utilized to stabilize the vortex state and eliminate any residual domain walls as the manufacturing process is completed.

In certain embodiments, the barrier layer 802 is a MgO tunnel barrier layer and may have a short funnel shape. Thus, the surface area of the barrier layer 802 can be adjusted by adjusting the funnel radius and/or the height of the reference layer (the fixed layer 902). With this configuration, the geometry has an extra parameter that is the funnel height, and this can be adjusted to get a desired match between the MTJ resistance and the select transistor current for a very broad range of MgO tunnel barrier layer thicknesses.

In certain embodiments having the conical funnel shaped geometric configuration described above, the following simplified formula (where shadowing effects are neglected and a perfectly parallel beam of deposited atoms is assumed) describes a thickness (t) of deposited material in the wafer plane (i.e., the X-Y plane shown in FIG. 1A) and a thickness of material deposited on cone walls:

$$t_{pillar}/t_{plane}=\cos(\alpha-\theta)/\cos(\theta)$$

where θ is the angle between a Z-axis direction that is normal to the X-Y plane of the wafer and the deposited beam direction (see e.g., FIG. 8), and where α is the cone angle (see e.g., FIG. 8). For example, for a cone angle of α=80 degrees and a deposition angle of θ=15 degrees (generally the angles shown in the formation of the SOT conductor layer 602 in FIG. 8), the thickness of the material deposited on the wafer plane (i.e., h3 in FIG. 8) is ~2.3 times thicker then material deposited at cone walls (i.e., w3 in FIG. 8). In certain examples, these deposition angles are preferred for barrier layer 802 deposition. The roughly two times thicker barrier layer 802 on the planar surfaces will eliminate tunneling of electrons in the bottom part of MTJ device 100 which is parallel to the X-Y wafer plane. On the other hand, for the SOT conductor 602 layer, the free layer 702, and the reference layer 902, the material should be deposited at higher angles (e.g., approximately 80 degrees) so that the thickness of the SOT conductor 602 layer and the magnetic materials on wafer plane will be approximately 5.7 times thinner than the corresponding layers deposited at the cone walls. In certain examples, the thickness of the free layer 702 ranges from about 1 nm to about 3 nm on the cone walls, the thickness of the fixed layer 902 ranges from about 3 nm to about 6 nm on the cone walls, and the thickness of the SOT conductor is about 5 nm on the cone walls, whereas the corresponding residual layers (i.e., the free layer 702, SOT conductor 602, and the fixed layer 902) at the bottom of concentric nano-funnels will be very thin (e.g., well below 1 nm). In practice, these very thin residual layers on the wafer surface (i.e., not on the cone walls) will be effectively nonconductive and nonmagnetic.

When forming the various layers described above, the deposition process may be performed by a deposition tool which is capable of depositing individual layers are various deposition angles which results in highly nonconformal thicknesses of these layers in the wafer. Although it is desirable to initially form the layers in the correct layer thicknesses (i.e., so that it is not necessary to reformat/manipulate/reprocess parts of these layers to achieve proper current flows for both write and read operation), additional processing could be performed in the case where the conducting layers in wafer plane should be passivated/removed if they are too thick. In the case layers are initially formed slightly thicker than desired, the desired part of these layers can be passivated by additional processing (e.g., post-process annealing or direct oxidation with oxygen beam). In this regard, a passivation process may be performed by a highly parallel beam of oxygen atoms which is perpendicular to the wafer surface, so that the parts of the layers laying in wafer plane will be converted to weakly conductive oxides. A removal process may be performed by a highly parallel beam of argon atoms at a specific etch angle to the wafer surface (i.e., an angle at which etch rates of etching a particular material is faster for the parts of the layers laying in wafer plane in comparison to parts of this layer located on slanted surfaces). It should be appreciated that the thicknesses of the layers discussed above are only examples, and these thicknesses (or widths or heights) may be varied accordingly to provide for conductive and nonconductive portions thereof as needed.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of manufacturing a magnetic tunnel junction device, the method comprising:
 forming a conical insulator core;
 forming a conductor layer on the insulator core;
 forming a magnetic free layer on the conductor layer;
 forming a barrier layer on the magnetic free layer; and
 forming a magnetic fixed layer on the barrier layer.

2. The method according to claim 1, wherein the insulator core is formed on a via fill layer.

3. The method according to claim 1,
 wherein the barrier layer is formed by deposition at a first deposition angle relative to a vertical axis of the insulator core, and
 wherein the conductor layer, the magnetic free layer and the barrier layer are formed by deposition at angles greater than the first deposition angle relative to the axis of the insulator core.

4. The method according to claim 1, wherein each of the conductor layer, the magnetic free layer, the barrier layer, and the magnetic fixed layer have horizontal portions thereof, and have sidewall portions thereof corresponding to a slanted surface of the conical insulator core.

5. The method according to claim 4,
wherein the horizontal portion of the conductor layer has a thickness that is less than a width of the sidewall portion of the conductor layer;
wherein the horizontal portion of the magnetic free layer has a thickness that is less than a width of the sidewall portion of the magnetic free layer;
wherein the horizontal portion of the barrier layer has a thickness that is greater than a width of the sidewall portion of the barrier layer; and
wherein the horizontal portion of the magnetic fixed layer has a thickness that is less than a width of the sidewall portion of the magnetic fixed layer.

6. The method according to claim 4,
wherein the horizontal portions of the conductor layer, the magnetic free layer and the magnetic fixed layer are formed to be thin enough to be at least essentially nonconductive, and
wherein the sidewall portions of the conductor layer, the magnetic free layer and the magnetic fixed layer are formed to be thick enough to be conductive.

7. The method according to claim 4,
wherein the horizontal portion of the barrier layer is formed to be thick enough to essentially preclude quantum tunneling, and
wherein the sidewall portion of the barrier layer is formed to be thin enough to allow for quantum tunneling.

8. The method according to claim 1, wherein the insulator core is a truncated conical shape having an upper surface thereof, and wherein an upper portion of the conductor layer is formed on the upper surface of the insulator core.

9. The method according to claim 8, further comprising forming a read bit line on the magnetic fixed layer.

10. The method according to claim 9, further comprising forming a write bit line on the upper portion of the conductor layer.

11. The method according to claim 1, wherein the conductor layer includes at least one of tungsten (W), platinum (Pt), tantalum (Ta), iridium (Ir), Hafnium (Hf), osmium (Os), bismuth (Bi), lead (Pb), IrMn, PtMn, Heusler alloys, $Bi_xSe_{1-x}$, $Bi_xSb_{1-x}$, $Bi_xSb_yTe_z$ and combinations thereof.

12. A magnetic tunnel junction device comprising:
a conical insulator core;
a conductor layer provided on the insulator core;
a magnetic free layer provided on the conductor layer;
a barrier layer provided on the magnetic free layer; and
a magnetic fixed layer provided on the barrier layer.

13. The magnetic tunnel junction device according to claim 12, further comprising a via fill layer, wherein the insulator core is formed on the via fill layer.

14. The magnetic tunnel junction device according to claim 12, wherein each of the conductor layer, the magnetic free layer, the barrier layer, and the magnetic fixed layer have horizontal portions thereof, and have sidewall portions thereof corresponding to a slanted surface of the conical insulator core.

15. The magnetic tunnel junction device according to claim 14,
wherein the horizontal portion of the conductor layer has a thickness that is less than a width of the sidewall portion of the conductor layer;
wherein the horizontal portion of the magnetic free layer has a thickness that is less than a width of the sidewall portion of the magnetic free layer;
wherein the horizontal portion of the barrier layer has a thickness that is greater than a width of the sidewall portion of the barrier layer; and
wherein the horizontal portion of the magnetic fixed layer has a thickness that is less than a width of the sidewall portion of the magnetic fixed layer.

16. The magnetic tunnel junction device according to claim 14,
wherein the horizontal portions of the conductor layer, the magnetic free layer and the magnetic fixed layer are formed to be thin enough to be at least essentially nonconductive and non-ferromagnetic, and
wherein the sidewall portions of the conductor layer, the magnetic free layer and the magnetic fixed layer are formed to be thick enough to be conductive and have desired ferromagnetic or ferrimagnetic properties.

17. The magnetic tunnel junction device according to claim 14,
wherein the horizontal portion of the barrier layer is formed thick enough to essentially preclude quantum tunneling, and
wherein the sidewall portion of the barrier layer is formed thin enough to allow for quantum tunneling.

18. The magnetic tunnel junction device according to claim 12, wherein the insulator core is a truncated conical shape having an upper surface thereof, and wherein an upper portion of the conductor layer is formed on the upper surface of the insulator core.

19. The magnetic tunnel junction device according to claim 18, further comprising forming a read bit line on the magnetic fixed layer.

20. The magnetic tunnel junction device according to claim 19, further comprising forming a write bit line on the upper portion of the conductor layer.

* * * * *